United States Patent
Barfoed et al.

(10) Patent No.: US 7,245,942 B2
(45) Date of Patent: Jul. 17, 2007

(54) MOBILE COMMUNICATIONS TERMINAL AND METHOD THEREFORE

(75) Inventors: Søren Barfoed, Copenhagen Oe (DK); Romel Amineh, Copenhagen (DK)

(73) Assignee: Nokia Corporation, Espoo (FI)

( * ) Notice: Subject to any disclaimer, the term of this patent is extended or adjusted under 35 U.S.C. 154(b) by 336 days.

(21) Appl. No.: 10/932,543

(22) Filed: Sep. 2, 2004

(65) Prior Publication Data

US 2006/0046781 A1 Mar. 2, 2006

(51) Int. Cl.
*H04B 1/38* (2006.01)
*H04M 1/00* (2006.01)

(52) U.S. Cl. .................... 455/566; 455/567

(58) Field of Classification Search .......... 455/550.1, 455/566–567, 415; 345/33, 82–83, 87–88; 379/127.01, 142.04, 245, 247, 354; 348/207
See application file for complete search history.

(56) References Cited

U.S. PATENT DOCUMENTS

| | | | |
|---|---|---|---|
| 6,035,180 A * | 3/2000 | Kubes et al. ............ 455/575.1 |
| 6,608,996 B1 * | 8/2003 | Laurikka et al. ........... 455/90.3 |
| 6,954,658 B2 * | 10/2005 | Engstrom et al. ........... 455/567 |
| 7,016,701 B2 * | 3/2006 | Colorado .................. 455/550.1 |
| 2002/0163524 A1 * | 11/2002 | Dutta ......................... 345/589 |
| 2003/0095596 A1 * | 5/2003 | Shimizu ................ 375/240.08 |
| 2004/0198455 A1 * | 10/2004 | Deeds ......................... 455/566 |
| 2005/0190196 A1 * | 9/2005 | O'Neil et al. ............... 345/589 |
| 2005/0272474 A1 * | 12/2005 | Blersch ...................... 455/566 |

FOREIGN PATENT DOCUMENTS

| | | |
|---|---|---|
| EP | 1 513 330 A1 | 3/2005 |
| FR | 2 821 233 | 8/2002 |
| JP | 2004062052 | 2/1996 |
| JP | 2004-064612 | 2/2004 |
| WO | WO 03/075254 A1 | 9/2003 |
| WO | WO 2004/026012 A1 | 3/2004 |
| WO | WO 2005/025193 A1 | 3/2005 |
| WO | WO 2005/112404 A1 | 11/2005 |

* cited by examiner

*Primary Examiner*—Nguyen Vo
(74) *Attorney, Agent, or Firm*—Perman & Green, LLP

(57) ABSTRACT

A mobile communication terminal comprising a user interface and a processor. The mobile communication terminal receives color data, from which the processor generates a colour scheme for the user interface. The light generating means receive the color scheme and provide a colored light to user interface in accordance with the color scheme.

20 Claims, 3 Drawing Sheets

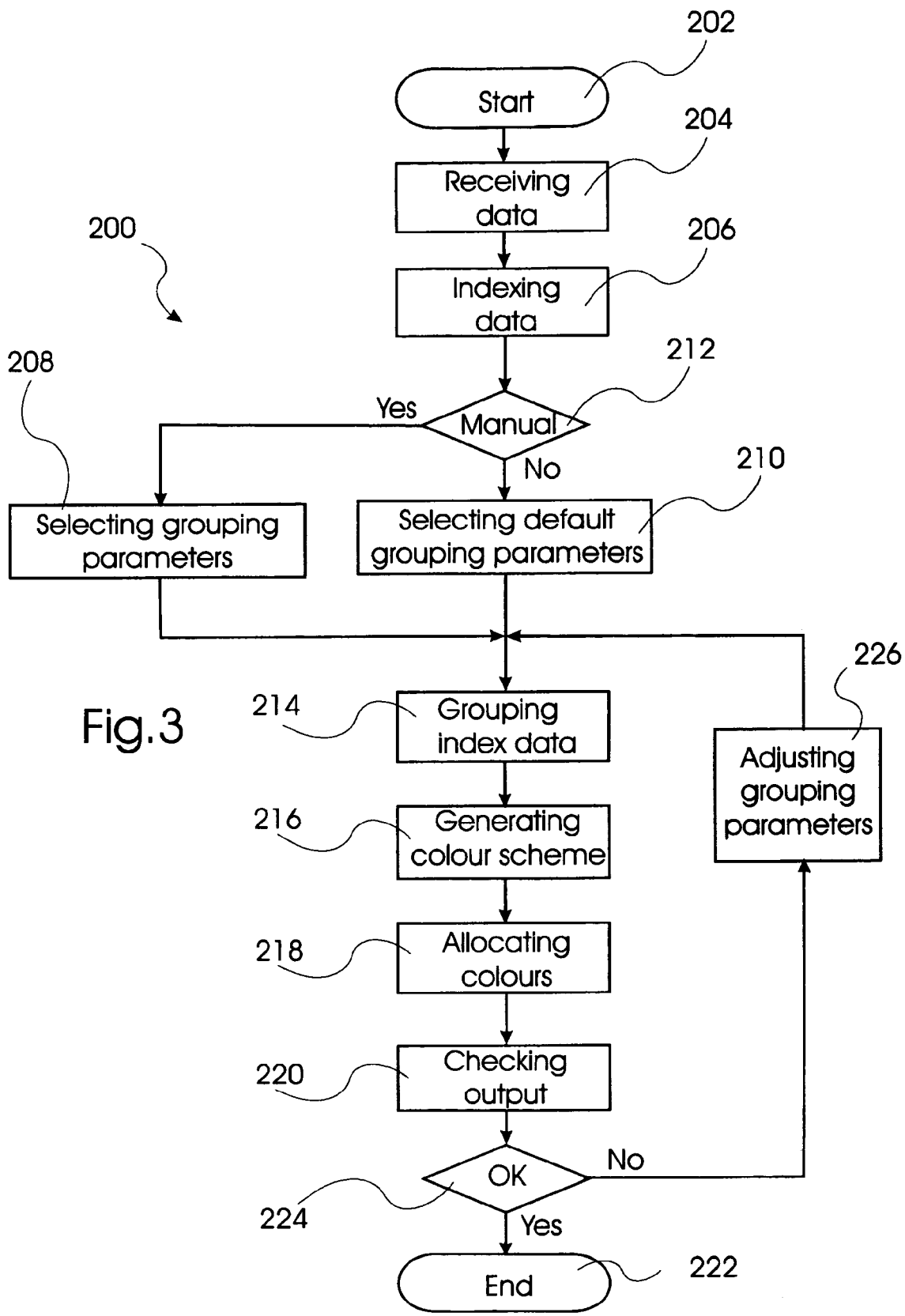

MOBILE COMMUNICATIONS TERMINAL AND METHOD THEREFORE

FIELD OF INVENTION

This invention relates to a mobile communication terminal, such as a mobile or cellular telephone, or rather relates to control of appearance and colour of the mobile communication terminal.

BACKGROUND OF INVENTION

In personal computers operating under Windows® or Apple® operating systems the user may change the wallpaper of the display into any desired colour or pattern and may in fact use a photograph as a wallpaper. Further, recent mobile telephones have been equipped with cameras so that a photograph taken by the mobile telephone may be used directly on the mobile telephone as a wallpaper.

Both in personal computers and in recent mobile telephones the wallpaper may be easily changed or altered. However, the colour scheme or pattern of the overall appearance of the mobile telephone is difficult to change (a differently coloured second physical cover may be required), which is time consuming and expensive.

SUMMARY OF THE INVENTION

An object of the present invention is to provide a mobile communication terminal having an overall appearance which easily is changed in accordance with any colour or pattern schemes.

A particular advantage of the present invention is provision of an appearance, which may be controlled by the mobile communication terminal in accordance with user preferences.

A particular feature of the present invention relates to the provision of a camera enabling a user of the mobile communication terminal to take a photograph and to utilize said photograph to generate a desired colour or pattern scheme.

The above object, advantage and feature together with numerous other objects, advantages and features, which will become evident from below detailed description, are obtained according to a first aspect of the present invention by a mobile communication terminal comprising a user interface and a processor, and wherein said mobile communication terminal is adapted to receive colour data, said processor is adapted to generate a colour scheme for said user interface based on said colour data, and wherein light generating means are adapted to receive said colour scheme and to provide a coloured light to said user interface in accordance with said colour scheme In this context the term "mobile communication terminal" is to be construed as a mobile or cellular telephone, a personal digital assistant, or a laptop computer. The term "colour scheme" is in this context to be construed as a colour theme or colour shade plan, which may be digitally stored and generated.

Further in this context the term "user interface" may be construed as a display and image(s) that provides the user with control information and are displayed on the display, and as the display together with a cover, a light guide, and a keypad.

The advantage of the mobile communication terminal according to the first aspect of the present invention is that the light generating means enable the operator of the terminal to control the colours of each of the elements of the mobile communication terminal. Hence the presentation or appearance of the mobile communication terminal may be matched to for example the operator's outfit or clothes.

The user of the mobile communication terminal may generate a photograph of the user's shirt, which photograph is then processed to generate a colour scheme for the terminal. The colour scheme may be generated to match the user's shirt. The colour scheme may comprise a colour pattern or a photograph, that is, the display of the terminal may present the photograph while the other elements of the terminal present colours matching the photograph.

The light generating means according to the first aspect of the present invention may comprise a light source having one or more multicoloured light diodes. In fact, the light source may have a plurality of sections of multicoloured light diodes adapted to be controlled by the processor. Alternatively or additionally, the light source may comprise a liquid crystal element or a series of liquid crystal elements adapted to be controlled by the processor.

The processor according to the first aspect of the present invention may further be adapted to perform:
  (a) receiving colour data from a colour data generator;
  (b) indexing of colours of pixels of said colour data and generating an array of indexed colours;
  (c) selecting a grouping parameter;
  (d) grouping of said indexed colours in accordance with said grouping parameter; and
  (e) allocating grouped colours to said user interface, keypad and cover of said mobile communication terminal.

By indexing the colours of the pixels of the photograph the processors may identify all colours of the photograph, and by grouping the indexed colours the processor may determine, which colours should be used for each element of the terminal, i.e. the display, keypad, or cover. This is particularly advantageous, since the display may present a photograph as a wallpaper, and the operational menus on the display are overlaying the wallpaper with colours in accordance with the colour grouping.

The above objects, advantages and features together with numerous other objects, advantages and features, which will become evident from below detailed description, are obtained according to a second aspect of the present invention by a method for generating a colour scheme for a mobile communication device comprising:
  (a) receiving colour data from a colour data generator;
  (b) indexing of colours of pixels of said colour data and generating an array of indexed colours;
  (c) selecting a grouping parameter;
  (d) grouping of said indexed colours in accordance with said grouping parameter; and
  (e) allocating grouped colours to a user interface, keypad and cover of said mobile communication terminal.

The colour data according to the second aspect may a photograph, a drawing, or any combination thereof. The colour data may be taken directly as a snapshot by the camera of the mobile communication terminal or be downloaded from a communication network. Alternatively, the colour data may be a piece of art generated or downloaded to the mobile communication terminal by the user.

The grouping parameter according to the second aspect of the present invention may comprise one or more elements establishing design criterion for the colour scheme. The grouping paramter may be selected by the user of the mobile communication terminal or may be a default value stored in the mobile communication terminal, or in fact, a combination thereof.

The colour scheme according to the second aspect of the present invention may comprise an overall plan for combining of colours and patterns that are to be applied to the display, keypad and cover of the mobile communication terminal. The colour scheme advantageously establishes a set of rules to be followed during the establishing a desired appearance of the mobile communication terminal.

The method according to the second aspect of the present invention may further comprise checking colour scheme output and feed back of an adjusted grouping parameter. The method thereby advantageously allows the mobile communication terminal for continuously make sure that the colour scheme utilized provides a visible user interface.

The above objects, advantages and features together with numerous other objects, advantages and features, which will become evident from below detailed description, are obtained according to a third aspect of the present invention by a computer program comprising code adapted to perform method according to the second aspect of the present invention when run on a mobile communication terminal according to the first aspect of the present invention.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, wherein:

FIG. 3, shows a flow chart of a process utilised by the mobile communication terminal according to the first embodiment of the present invention.

DETAILED DESCRIPTION OF PREFERRED EMBODIMENTS

In the following description of the various embodiments, reference is made to the accompanying drawings, which show by way of illustration various embodiments, in which the invention may be practiced. It is to be understood that other embodiments may be utilized, and structural and functional modifications may be made without departing from the scope of the present invention.

Figure 1:
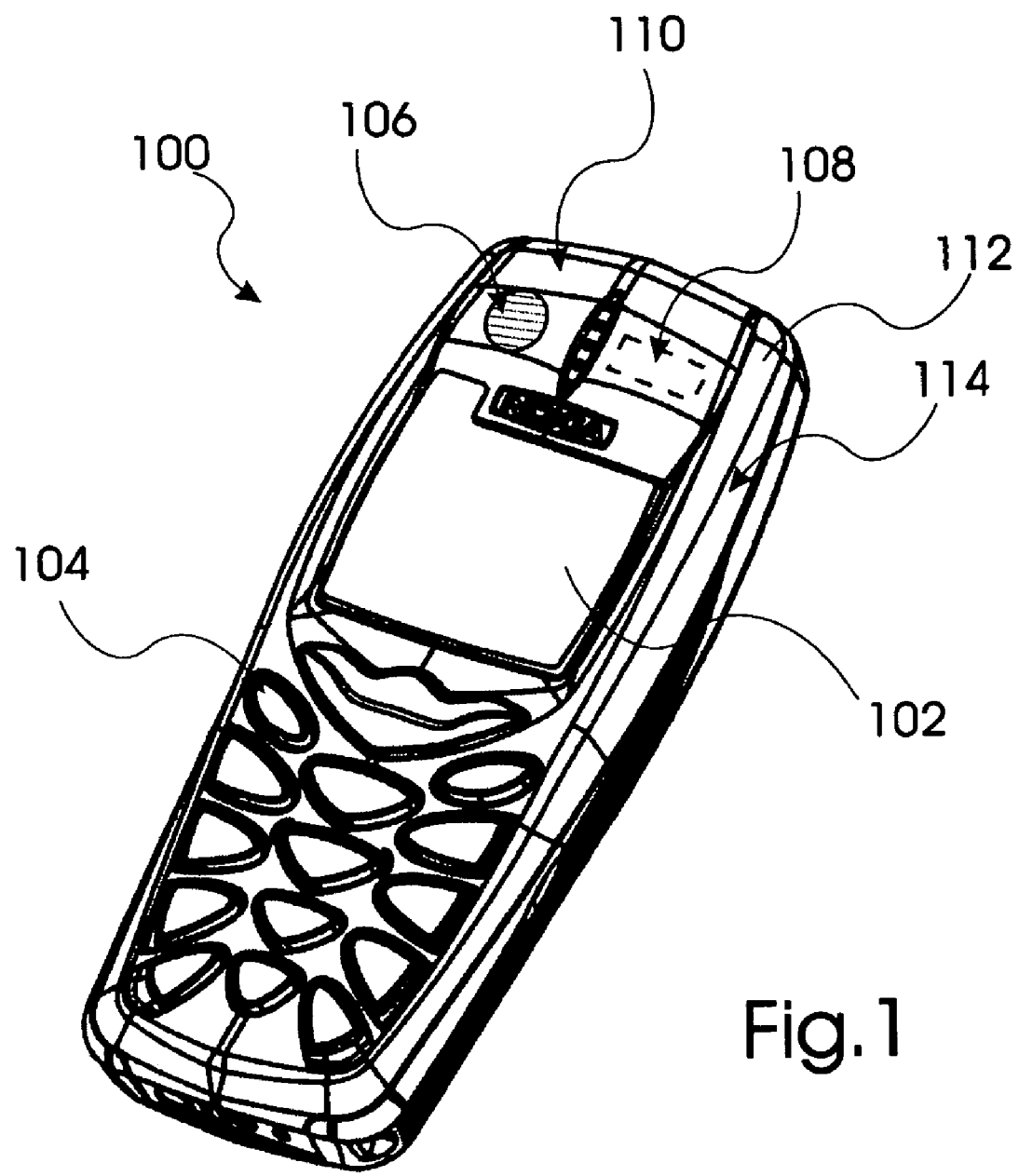
FIG. 1, shows a mobile communication terminal according to a first embodiment of the present invention.

FIG. 1 shows a mobile communication terminal designated in entirety by reference numeral 100. The mobile communication terminal 100 comprises a display 102 and a keypad 104 enabling the user of the mobile communication terminal 100 to interface with the mobile communication terminal 100. The mobile communication terminal 100 further comprises a camera 106 for taking of photographs, which may be presented on the display 102 in accordance with the user's instructions. The camera 106 is shown in FIG. 1 positioned on the front side of the mobile communication terminal 100 entirely for simplicity reasons, the camera 106 may appropriately be positioned on any surface of the mobile communication terminal 100. In particular, the camera 106 may advantageously be positioned on the rear surface of the mobile communication terminal 100, so that the user may concurrently see in the display 102 what is targeted in the the camera view.

The mobile communication terminal 100 further internally comprises a colour controlling device 108, which enables the user to control the colour and thereby appearance of the mobile communication terminal 100. For example, the user may take a photograph and apply this photograph as a wallpaper on the display 102 and further instruct the colour controlling device 108 to generate a colour scheme, which is implemented in the display 102, in the keypad 104 and in selected cover parts 110, such as for example the edge 112 of the cover 114.

Figure 2:
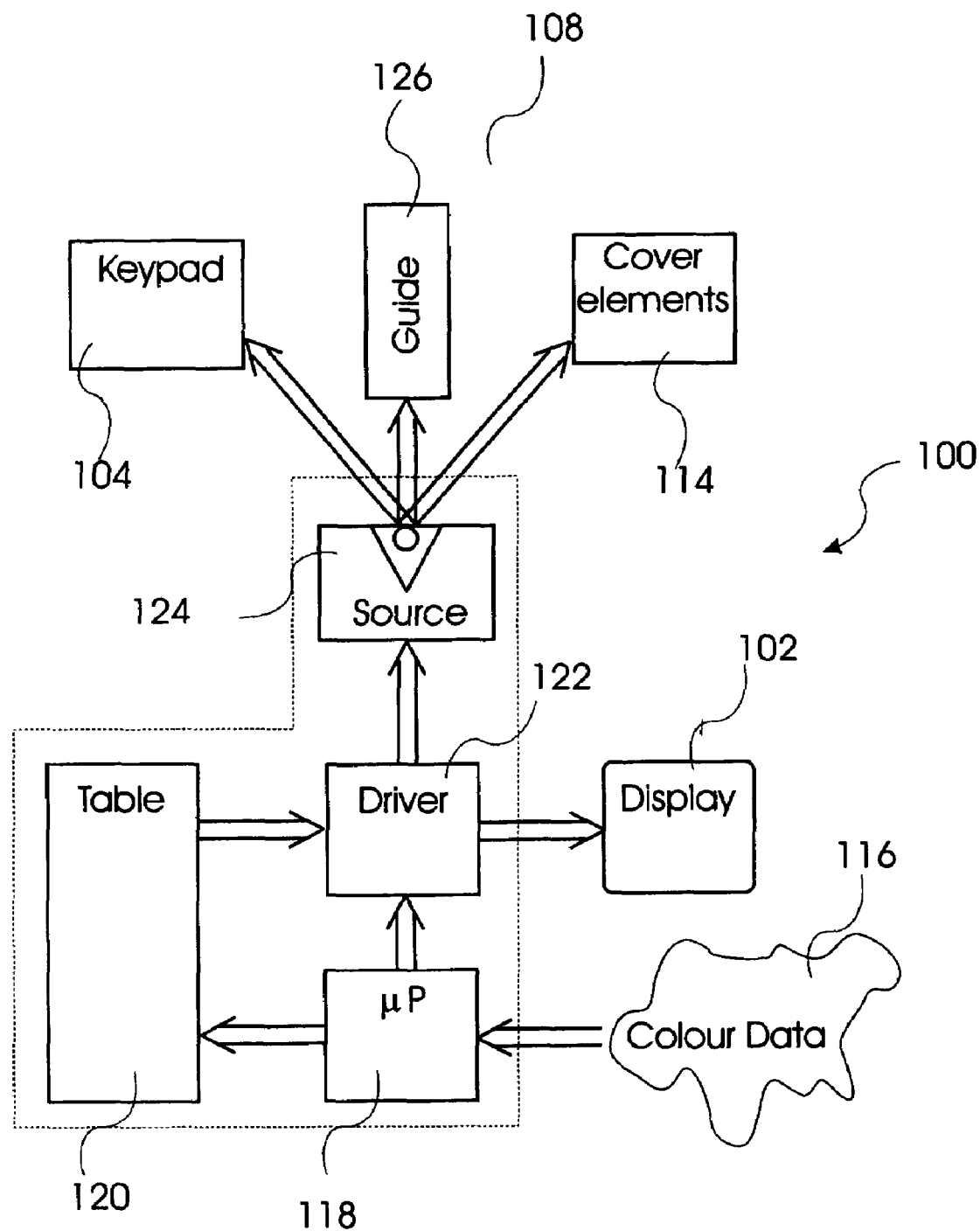
FIG. 2, shows a block diagram of the mobile communication terminal according to a first embodiment of the present invention.

FIG. 2 shows a block diagram of the mobile communication terminal 100 described above. Further, FIG. 2 shows in detail the colour controlling device 108 communicating with the display 102, the keypad 104, and the cover 114.

The colour controlling device 108 receives colour data 116, for example a photograph or video stream received from the camera 106 or downloaded from a communication network. The user of the mobile communication terminal 100 may use the camera 106 for panning over an area thereby generating a video sequence on the display 102 and at any point press a key on the keypad 104 so as to freeze the camera view as a photograph. This photograph may then be used for generating a colour scheme for the mobile communication terminal 100.

The colour controlling device 108 comprises a processor 118, such as a microprocessor or a micro-controller, which is adapted to receive the colour data 116. The processor 118 indexes the colour data 116 in an array of colours, which are detected in the colour data 116. For example, if the colour data is a photograph having 256 colours an index array of 16 by 16 is generated. Obviously, the photograph and the colour data 116 as such may have any number of colours, such as in the range between 3 to 1024.

The term "colour" should in this context include any scale of grey. That is, the colour data 116 may be a grey scaled photograph.

The processor 118 groups the colours of the index array in accordance with a selected design criterion. The processor 118 uses the grouped colours for generating a colour scheme to be loaded in to table 120. The table 120 may be implemented as any ordinary random access memory. The colour scheme describes allowable combinations of colours, i.e. which colours may be used in combination with the colour data 116. For example, the photograph may show a steel grey building, and therefore one design criterion may be to allow colours in the grey scale to be used for menus overwriting the photograph when used as wallpaper on the display 102. Obviously, the design criterion may include physiological parameters, which define the most visible colour combinations.

The processor 118 forwards a control signal to a device driver 122 for controlling colours of the display 102 and a light source 124. The display 102 and the light source 124 are driven by the device driver 122 in accordance with the colour scheme generated by the processor 118.

The light source 124 may comprise one or more multi-coloured light emitting diodes (LED) and/or liquid crystal panels. The light generated by the light source 124 is communicated to the keypad 104 and selected cover parts of the cover 114. The light is shown in FIG. 2 as further communicated to a light guide 126. One or more LEDs may be positioned appropriately under the keypad 104 and under opaque parts of the cover 114.

FIG. 3 shows a flow chart of a method 200 to be performed by the processor 118. The method 200 may be implemented as a computer program to be run by the processor 118 in the mobile communication terminal 100.

The method 200 initiates in step 202, during which variables are initialized and constants recorded. Subsequently the processor 118 is ready for receiving colour data 116 during step 204. The colour data 116 are indexed in an array as described above during step 206. The colours of the array are to be grouped according to a design criterion established by grouping parameters. The grouping parameters are either manually (step 208) or automatically (step 210) selected. That is, the mobile communication terminal 100 enables the user to select amongst a wide varieties of design criterions, such as psychedelic, metallic or soft tone. The mobile communication terminal 100 further enables the user to download design criterions from the communication network.

The user of the mobile communication terminal 100 responds to the processor 118, whether the grouping parameters are to be manually or automatically selected during step 212. The mobile communication terminal 100 enables the user to pre-set responses to be given in step 212, so that no user involvement is required during the method 200.

The indexed colours are grouped together in accordance with the grouping parameters during step 214 and, subsequently, a colour scheme is generated.

During step 218 the colours in the colour scheme are allocated to menus to be presented in the display 102, to parts of the cover 114, and/or to the keypad 104.

In order to ensure, in particular, that the menus are visible to a user in the display 102, the colour scheme output, i.e. the menus overlaying a wallpaper in the display 102 and the colours of the keypad 104 and cover 114, is checked during step 220. If the colour scheme output is okay the method 200 terminates during step 222. If on the other hand the colour scheme output is not okay, which is resolved during step 224, the grouping parameters are adjusted during step 226 and fed back to the grouping step 214.

The invention claimed is:

1. A mobile communication terminal comprising a user interface and a processor, wherein said mobile communication terminal is adapted to receive color data, said processor is adapted to generate a color scheme for said user interface based on said color data, and wherein light generating means are adapted to receive said color scheme and to provide a colored light to said user interface in accordance with said color scheme where the color scheme is applied to at least menus presented through the user interface and the processor is further configured to check the menus against a wallpaper in a display of the terminal so that the menus are visible to a user.

2. A mobile communication terminal according to claim 1, wherein said color data comprises a color pattern or a photograph.

3. A mobile communication terminal according to claim 1, wherein said light generating means comprises a driver and a light source.

4. A mobile communication terminal according to claim 3, wherein said light source comprises one or more multicolored light diodes, a plurality of sections of multicolored light diodes, or a combination of one or more multicolored light diodes and a plurality of sections of multicolored light diodes.

5. A mobile communication terminal according to claim 3, wherein said light source comprises a liquid crystal element.

6. A mobile communication terminal according to claim 1, wherein said user interface comprises a display.

7. A mobile communication terminal according to claim 6, wherein said light generating means comprises a display driver and the display and wherein said colored light provided by the light generating means comprises a display image adapted to be shown on the display.

8. A mobile communication terminal according to claim 7, wherein said user interface further comprises a cover, a light guide, and a keypad.

9. A mobile communication terminal according to claim 1 further comprising a memory and a table for storing said color scheme.

10. A mobile communication terminal according to claim 1 further comprising a camera adapted to generate a photograph to be utilised as said color data.

11. A mobile communication terminal according to claim 1, wherein said processor further is adapted to perform:
(a) receiving said color data;
(b) indexing of colors of pixels of said color data and generating an array of indexed colors;
(c) selecting a grouping parameter;
(d) grouping of said indexed colors in accordance with said grouping parameter; and
(e) allocating grouped colors to said user interface of said mobile communication terminal.

12. A mobile communication terminal according to claim 1, wherein the terminal includes a display, a keypad and a cover and the processor is further configured to index all colors in the color data and determine, though grouping the indexed colors, which colors should be implemented in the display, the keypad and in selected cover parts.

13. A method for generating a color scheme for a mobile communication device comprising:
(a) receiving color data from a color data generator;
(b) indexing of colors of pixels of said color data and generating an array of indexed colors;
(c) selecting a grouping parameter;
(d) grouping of said indexed colors in accordance with said grouping parameter;
(e) allocating grouped colors to a user interface of said mobile communication device, where the grouped colors are applied to at least menus presented through a user interface of the mobile communication device; and
(f) checking the menus against a wallpaper in a display of the mobile communication device so that the menus are visible to a user.

14. A method according to claim 13, wherein said user interface comprises a display.

15. A method according to claim 14, wherein said user interface further comprises a cover, a light guide, and a keypad.

16. A method according to claim 13, wherein said color data comprises a photograph, a drawing, or a combination of a photograph and a drawing.

17. A method according to claim 13, wherein said grouping parameter comprises one or more elements establishing design criterion for said color scheme.

18. A method according to claim 13, wherein said grouping parameter is selected by the user of said mobile communication terminal, is a default value stored in said mobile communication device, or a combination thereof.

19. A method according to claim 13 further comprises checking color scheme output and feedback of an adjusted grouping parameter.

20. A computer readable medium embodied with a computer program comprising program code, which, when being executed in a processor of a mobile communication terminal, causes the mobile communication terminal to:

receive color data from a color data generator;
index colors of pixels of said color data and generating an array of indexed colors;
select a grouping parameter;
group said indexed colors in accordance with said grouping parameter;
allocate grouped colors to a user interface of said mobile communication terminal where the grouped colors are applied to at least menus presented through a user interface of the mobile communication terminal; and
check the menus against a wallpaper in a display of the mobile communication terminal so that the menus are visible to a user.

* * * * *